United States Patent
Hwang et al.

(10) Patent No.: US 6,697,413 B2
(45) Date of Patent: Feb. 24, 2004

(54) TUNABLE VERTICAL-CAVITY SURFACE-EMITTING LASER WITH TUNING JUNCTION

(75) Inventors: Wen-Yen Hwang, Sugar Land, TX (US); Chih-Hsiang Lin, Sugar Land, TX (US); Jun Zheng, Houston, TX (US); James N. Baillargeon, Springfield, NJ (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 273 days.

(21) Appl. No.: 10/000,672

(22) Filed: Oct. 31, 2001

(65) Prior Publication Data

US 2003/0081642 A1 May 1, 2003

(51) Int. Cl.$^7$ .............................................. H01S 5/187
(52) U.S. Cl. ........................................ 372/96; 372/20
(58) Field of Search ............................ 372/96, 45, 20

(56) References Cited

U.S. PATENT DOCUMENTS

| 5,216,686 A | 6/1993 | Holm et al. ................. 372/45 |
| 5,283,447 A | 2/1994 | Olbright et al. .............. 257/85 |
| 6,445,495 B1 * | 9/2002 | Walker et al. ............. 359/344 |
| 6,611,539 B2 * | 8/2003 | Ledentsov et al. ........... 372/20 |

OTHER PUBLICATIONS

Stone, R. J. et al., "Independent Phase and Magnitude Control of an Optically Carried Microwave Signal with a Three–Terminal Vertical–Cavity Surface–Emitting Laser," *IEEE Photonics Technology Letters*, vol. 11, No. 5, (Apr. 1999), pp. 463–465.

Wipiejewski, T. et al., "Tunable Extremely Low Threshold Vertical–Cavity Laser Diodes," *IEEE Photonics Technology Letters*, vol. 5, No. 8, (Aug. 1993), pp. 889–892.

Hudgings, Janice A. et al., "Dynamic Behavior and Applications of a Three–Contact Vertical–Cavity Surface–Emitting Laser," *IEEE Journal of Selected Topics in Quantum Electronics*, vol. 5, No. 3, May/Jun. (1999), pp. 512–519.

Zucker, J. E. et al., Large Refractive Index Changes in Tunable–Electron–Density InGaAs/InAlAs Quantum Wells, *IEEE Photonics Technology Letters*, vol. 2, No. 1, Jan. (1990), pp. 29–31.

Thirstrup, Carsten, "Refractive Index Modulation Based on Excitonic Effects in GaInAs–InP Coupled Asymmetric Quantum Wells," *IEEE Journal of Quantum Electronics*, vol. 31, No. 6, Jun. (1995), pp. 988–996.

Amann, Markus–Christian, "Single–Mode and Tunable Laser Diodes," *Semiconductor Lasers II: Materials and Structures*, Academic Press, 1999, Chapter 3, pp. 157–251. (no month).

* cited by examiner

*Primary Examiner*—James Davie
(74) *Attorney, Agent, or Firm*—N. Stephan Kinsella; Conley Rose, P.C.; Gentry E. Crook

(57) ABSTRACT

An embodiment of a surface-emitting laser structure includes a first semiconductor region of a first conductivity type coupled to a first contact and a second semiconductor region of the same conductivity type coupled to a second contact. A third semiconductor region of the opposite conductivity type is coupled to a third contact and interposed between the first and second semiconductor regions. An active region is interposed between the first and third regions. In a further embodiment, the laser structure may include a variable refractive index structure interposed between the second and third semiconductor regions. In another embodiment, a surface-emitting laser structure may include an active region between a first semiconductor region of a first conductivity type coupled to a first contact, and a second As semiconductor region of opposite conductivity type coupled to a second contact. A third electrical contact is dielectrically spaced from the second semiconductor region.

18 Claims, 6 Drawing Sheets

TUNABLE VERTICAL-CAVITY SURFACE-EMITTING LASER WITH TUNING JUNCTION

BACKGROUND OF THE INVENTION

1. Field of the Invention

This invention relates generally to devices that emit electromagnetic radiation and, in particular, to tunable vertical cavity surface emitting lasers (VCSELs).

2. Description of the Related Art

The following descriptions and examples are not admitted to be prior art by virtue of their inclusion within this section.

Lasers have a wide range of industrial and scientific uses. There are several types of lasers, including gas lasers, solid-state lasers, liquid (dye) lasers, and free electron lasers. Semiconductor lasers are also in use. In semiconductor lasers, electromagnetic waves are amplified in a semiconductor superlattice structure. Semiconductor lasers may be diode lasers (bipolar) or non-diode lasers such as quantum cascade (QC) lasers (unipolar). Semiconductor lasers are used for a variety of applications and can be built with different structures and semiconductor materials, such as gallium arsenide (GaAs).

The use of semiconductor lasers for forming a source of optical energy is attractive for a number of reasons. Semiconductor lasers have a relatively small volume and consume a small amount of power as compared to conventional laser devices. Further, semiconductor lasers can be fabricated as monolithic devices, which do not require a combination of a resonant cavity with external mirrors and other structures to generate a coherent output laser beam.

A semiconductor laser typically comprises an active (optical gain) region sandwiched between two mirrors (reflectors or reflective planes). There is typically a small difference in reflectivity between the two mirrors, one of which (typically, the reflective plane having lower reflectivity) serves as the "exit" mirror. The area between the reflective planes is often referred to as the resonator, or the Fabry-Perot resonance cavity in some cases. The active region is located within the resonant cavity. When the active region is pumped with an appropriate pumping energy, it produces photons, some of which resonate and build up to form coherent light in the resonant cavity formed by the two mirrors. A portion of the coherent light built up in the resonating cavity formed by the active region and top and bottom mirrors passes through one of the mirrors (the exit mirror) as the output laser beam.

Various forms of pumping energy may be utilized to cause the active region to begin to emit photons and to achieve gain. For example, semiconductor lasers of various types may be electrically pumped (EP) (by a DC or alternating current), or pumped in other ways, such as by optical pumping (OP) or electron beam pumping. In an EP VCSEL, for example, an electrical potential difference is typically applied across the active region (via top and bottom electrical contacts provided above and below the active region). As a result of the potential applied, a pumping current flows through the active region, i.e. charge carriers (electrons and holes) are injected from opposite directions into the active region where recombination of electron and holes occurs. There are two kinds of recombination events, i.e. radiative and non-radiative, concurrently happening in the active region. When radiative recombination occurs, a photon is emitted with the same energy as the difference in energy between the hole and electron energy states. Some of those photons travel in a direction perpendicular to the reflectors of the laser. As a result of the ensuing reflections, the photons can travel through the active region multiple times.

Stimulated emission occurs when radiative recombination of an electron-hole pair is stimulated by interaction with a photon. In particular, stimulated emission occurs when a photon with an energy equal to the difference between an electron's energy and a lower energy interacts with the electron. In this case, the photon stimulates the electron to fall into the lower energy state, thereby emitting a second photon. The second photon will have the same energy and frequency as the original photon, and will also be in phase with the original photon. Thus, when the photons produced by spontaneous electron transition interact with other high energy state electrons, stimulated emission can occur so that two photons with identical characteristics are present. (Viewed as waves, the atom emits a wave having twice the amplitude as that of the original photon interacting with the atom.) If a sufficient amount of radiative recombinations are stimulated by photons, the number of photons traveling between the reflectors tends to increase, giving rise to amplification of light and lasing. The result is that coherent light builds up in the resonant cavity formed by the two mirrors, a portion of which passes through the exit mirror as the output laser beam.

Semiconductor lasers may be edge-emitting lasers or surface-emitting lasers (SELs). Edge-emitting semiconductor lasers output their radiation parallel to the wafer surface, while in SELs, the radiation output is perpendicular to the wafer surface. One type of SEL is the vertical-cavity surface-emitting laser (VCSEL). The "vertical" direction in a VCSEL is the direction perpendicular to the plane of the substrate on which the constituent layers are deposited or epitaxially grown, with "up" being typically defined as the direction of epitaxial growth. In some designs, the output laser beam is emitted out of the top side, in which case the top mirror is the exit mirror. In other designs, the laser beam is emitted from the bottom side, in which case the bottom mirror is the exit mirror. The exit mirror typically has slightly lower reflectivity than the other mirror.

VCSELs have many attractive features compared to edge-emitting lasers, such as low threshold current, single longitudinal mode, a circular output beam profile, a smaller divergence angle, and scalability to monolithic laser arrays. The shorter cavity resonator of the VCSEL provides for better longitudinal mode selectivity, and hence narrower linewidths. Additionally, because the output is perpendicular to the wafer surface, it is possible to test fabricated VCSELs on the wafer before extensive packaging is done, in contrast to edge-emitting lasers, which must be cut from the wafer to test the laser. Also, because the cavity resonator of the VCSEL is perpendicular to the layers, there is no need for the cleaving operation common to edge-emitting lasers.

The VCSEL structure usually consists of an active (optical gain) region sandwiched between two mirrors, such as distributed Bragg reflector (DBR) mirrors. Both EP and OP VCSEL designs are possible. The two mirrors may be referred to as a top DBR and a bottom DBR. Because the optical gain is low in a vertical cavity design, the reflectors require a high reflectivity in order to achieve a sufficient level of feedback for the device to lase.

DBRs are typically formed of multiple pairs of layers referred to as mirror pairs. DBRs are sometimes referred to as mirror stacks. The pairs of layers are formed of a material system generally consisting of two materials having different indices of refraction and being easily lattice matched to the other portions of the VCSEL, to permit epitaxial fabrication techniques. The layers of the DBR are quarter-wave optical-thickness (QWOT) layers of alternating high and low refractive indices, where each mirror pair contains one high and one low refractive index QWOT layer. The number of mirror pairs per stack may range from 20–40 pairs to achieve a high percentage of reflectivity, depending on the difference between the refractive indices of the layers. A larger number of mirror pairs increases the percentage of reflected light (reflectivity).

The DBR mirrors of a typical VCSEL can be constructed from dielectric (insulating) or semiconductor layers (or a combination of both, including metal mirror sections). The difference between the refractive indices of the layers of the mirror pairs can be higher in dielectric DBRs, generally imparting higher reflectivity to dielectric DBRs than to semiconductor DBRs for the same number of mirror pairs and overall thickness. Conversely, in a dielectric DBR, a smaller number of mirror pairs can achieve the same reflectivity as a larger number in a semiconductor DBR. However, it is sometimes necessary or desirable to use semiconductor DBRs, despite their lower reflectivity/greater thickness, to conduct current, for example (e.g., in an EP VCSEL). Semiconductor DBRs also have higher thermal (heat) conductivity than do dielectric DBRs, making them more desirable for heat-removal purposes, other things being equal. Semiconductor DBRs may also be preferred for manufacturing reasons (e.g., a thicker DBR may be needed for support) or fabrication reasons (e.g., an epitaxial, i.e. semiconductor, DBR may be needed if other epitaxial layers need to be grown on top of the DBR).

When properly designed, these mirror pairs will cause a desired reflectivity at the laser wavelength. Typically in a VCSEL, the mirrors are designed so that the bottom DBR mirror (i.e. the one interposed between the substrate material and the active region) has nearly 100% reflectivity, while the top (exit) DBR mirror has a reflectivity that may be 98%–99.5% (depending on the details of the laser design). The partially reflective top (exit) mirror passes a portion of the coherent light built up in the resonating cavity formed by the active region and top and bottom mirrors. Of course, as noted above, in other designs, the bottom mirror may serve as the exit mirror and the top mirror have the higher reflectivity. VCSELs, DBRs, and related matters are discussed in further detail in *Vertical-Cavity Surface-Emitting Lasers: Design, Fabrication, Characterization, and Applications*, eds. Carl W. Wilmsen, Henryk Temkin & Larry A. Coldren (Cambridge: Cambridge University Press, 1999).

VCSELs are used in a variety of applications. In telecommunications, for example, output laser light of a precise wavelength is modulated to encode and transmit information. The laser may be externally modulated, or directly modulated. A typical telecommunications system uses optical fiber to guide the radiation from the modulation (or emission) point to the detection point. Long wavelength (1.3 $\mu$m to 1.55 $\mu$m) VCSELs are of great interest in the optical telecommunications industry because of the minimum fiber dispersion at 1310 nm and the minimum fiber loss at 1.55 $\mu$m (1550 nm).

In various communications—e.g., telecommunications—applications, it is desirable that the emitted laser radiation of a given semiconductor laser have one of a number of precisely specified wavelengths, for example those specified by the International Telecommunications Union (ITU) grid. For example, the ITU grid specifies lasing wavelengths of 1.55 $\mu$m (and other closely spaced wavelengths). Other lasing wavelengths, such as 1310 nm (and other closely spaced wavelengths), may also be employed. The ITU grid wavelengths and others are used in telecommunications applications such as coarse and dense wavelength-division multiplexing (CWDM and DWDM). In WDM, typically used in optical fiber communications, two or more optical (e.g. laser) signals having different wavelengths are simultaneously transmitted in the same direction over one fiber, and then are separated by wavelength at the distant end. In the act event of a failure of a laser operating at a particular wavelength, for example, or a change in the particular wavelengths needed for a particular link, reconfiguration of the wavelength at which a laser can operate would be extremely useful.

For at least these reasons, it is desirable to provide a tunable VCSEL, i.e. a VCSEL having an output wavelength corresponding to a selectable tuning parameter. Some approaches used in attempts to tune various types of lasers are described in B. Pezeshki, "New Approaches to Laser Tuning," *Optics & Photonics News*, 34–38 (May 2001). These include temperature variation, combination of multiple lasers having different wavelengths on a single chip, and movement of micromechanical components. The wavelength range provided by temperature variation is relatively small, however, and the other approaches may be undesirably complex. Tuning of a laser by direct application of an electrical signal would therefore be desirable. But such tuning should preferably be independent of other properties of the laser. For example, VCSELs can have a wavelength significantly dependent on drive current (or some other tuning parameter). However, it is typically also desired that the gain (i.e., output power or intensity) be constant (or otherwise selectable) over different wavelengths. Unfortunately, when the drive current is changed in order to change wavelength, in conventional VCSELs the gain is also changed, since it is also related to the drive current.

There is, therefore, a need for improved VCSELs and methods for tuning same while controlling their gain.

BRIEF DESCRIPTION OF THE DRAWINGS

Other features and advantages of the invention will become apparent upon study of the following description, taken in conjunction with the attached drawings in which.

DETAILED DESCRIPTION OF THE PREFERRED EMBODIMENTS

Figure 1:
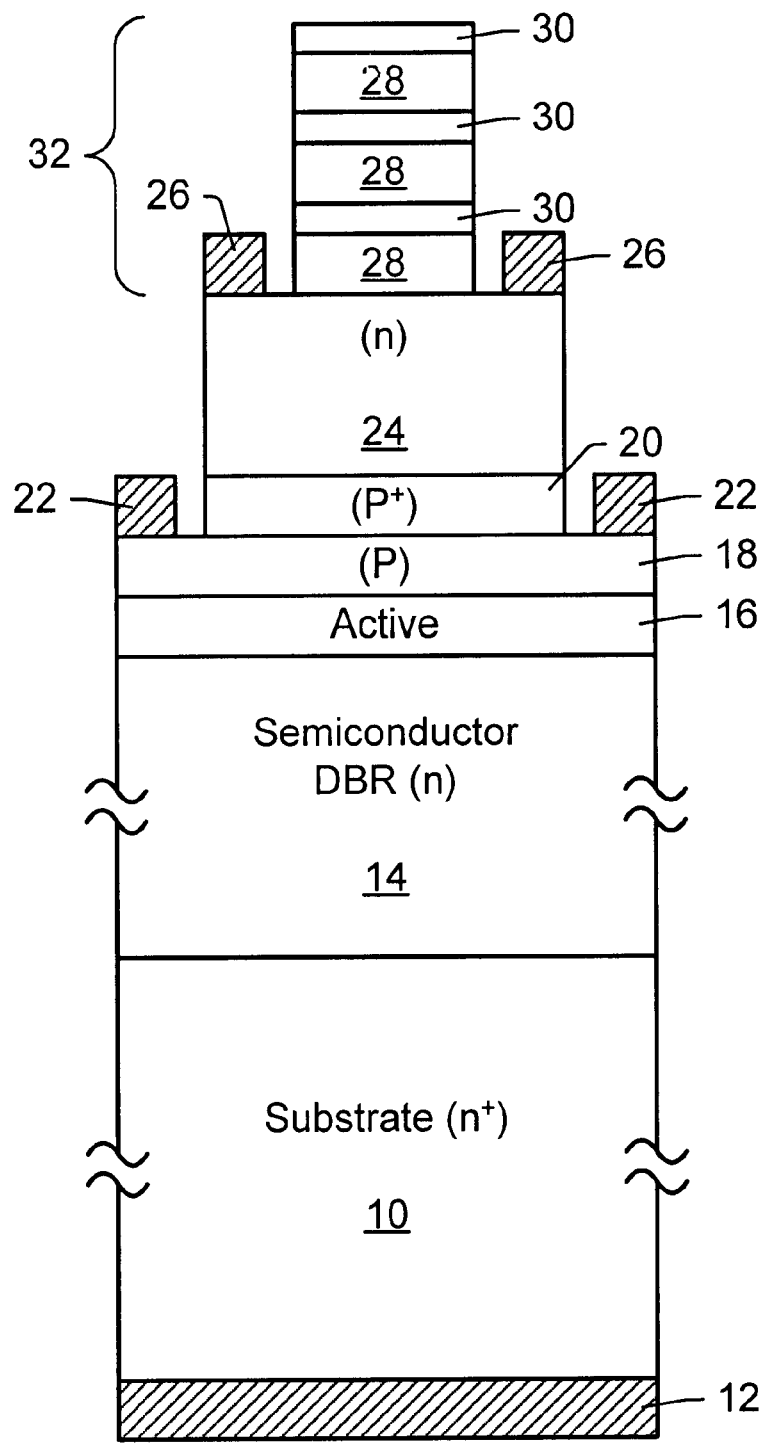
FIG. 1 is a cross-sectional illustration of the layer structure of an exemplary embodiment of a 3-terminal VCSEL with a tuning junction.

Referring now to the drawings, the details of preferred embodiments of the invention are schematically illustrated.

An embodiment of a surface-emitting laser structure described herein includes a first semiconductor region of a first conductivity type (either n- or p-type) coupled to a first electrical contact and a second semiconductor region of the same conductivity type coupled to a second electrical contact. A third semiconductor region of a second conductivity type opposite to the first conductivity type is coupled to a third electrical contact and interposed between the first and second semiconductor regions. An active region is interposed between the first and third regions, and the portion of the laser structure extending between the second and third contacts is substantially transparent to radiation at the lasing wavelength of the structure. In other words, the structure includes an additional p-n junction as compared to a traditional VCSEL structure, but no absorbing region has been added. The first and third regions and the active region they bound may function similarly to a traditional laser p-n junction, while the second and third regions form an additional p-n junction which may be considered a tuning junction for the device.

The wavelength of a laser including the above-described structure may be tuned through application of a potential difference across the tuning junction. In an embodiment, forward biasing of the tuning junction is used to alter the free carrier density in the vicinity of the tuning junction. Altering the free carrier density may in turn alter the refractive index in this region. The tuning junction is formed within the laser cavity, so that a change in the refractive index near the tuning junction may alter the effective cavity length, and thereby the lasing wavelength.

The above-described laser structure may further include a variable refractive index structure interposed between the second and third semiconductor regions. This variable refractive index structure may therefore be within the tuning junction. Applying a potential difference across the tuning junction in this embodiment may have the effect of altering the electric field applied to the variable refractive index structure. Such a field application and/or alteration may alter the refractive index of the structure, through, for example, the Stark effect. In an embodiment, the variable refractive index structure is a multiple quantum well (MQW) structure. The refractive index of such an MQW structure may be altered through, for example, the quantum-confined Stark effect. Information on the quantum-confined Stark effect, along with other effects altering refractive index in quantum well structures, may be found in Zucker, et al., "Large Refractive Index Changes in Tunable-Electron-Density InGaAs/InAlAs Quantum Wells," *IEEE Photon. Techn. Lett.* 8, 29–31 (1990), and Thirstrup, "Refractive Index Modulation Based on Excitonic Effects in GaInAs-InP Coupled Asymmetric Quantum Wells," *IEEE J. Quantum Elect.* 31, 988–993 (1995), which references are hereby incorporated by reference as if fully set forth herein. Since the variable refractive index region is formed within the laser cavity, altering the refractive index of this region may alter the effective cavity length, and thereby the laser wavelength.

In another embodiment of a surface-emitting laser structure, a first semiconductor region of a first conductivity type is coupled to a first electrical contact and a second semiconductor region of the same conductivity type is coupled to a second electrical contact. A third semiconductor region having a conductivity type opposite to the first conductivity type is coupled to a third electrical contact and interposed between the first and second semiconductor regions. An MQW region is interposed between the second and third semiconductor regions, and an active region is interposed between the first and third semiconductor regions.

In still another embodiment, a surface-emitting laser structure may include a first semiconductor region of a first conductivity type coupled to a first electrical contact, and a second semiconductor region of opposite conductivity type coupled to a second electrical contact. An active region is interposed between the first and second semiconductor regions, and a third electrical contact is dielectrically spaced from the second semiconductor region. Such a structure may be applicable to a method of tuning a surface-emitting laser which includes electrically modulating a cross-sectional area of a gain region of the laser. Applying a potential difference between the second and third contacts may modulate the width of a depletion region encircling a portion of the device.

VCSEL With Tuning Junction

A cross-sectional view of the layer structure of an embodiment of a tunable VCSEL structure is shown in FIG. 1. In the embodiment of FIG. 1, ohmic contact 12 is formed on the back side of n-type substrate 10. An n-type semiconductor-based DBR 14 is formed on top of substrate 10. Active region 16 is formed between DBR 14 and p-type semiconductor region 18, to which a second ohmic contact 22 is made. A more heavily doped p-type region 20 is formed over region 18. An n-type semiconductor region 24 and layers 18 and 20 make up a second p-n junction within the structure (in addition to the junction bounding active region 16). This junction may be referred to herein as a tuning junction. Another ohmic contact 26 is formed to region 24. A dielectric-based DBR 32 completes the laser cavity in the embodiment of FIG. 1, in which layers 28 alternate with layers 30. The structure of FIG. 1, as well as the other structures shown herein, is not drawn to scale. In particular, the vertical dimensions may be exaggerated with respect to the horizontal dimensions.

In an embodiment, substrate 10 is heavily doped n-type indium phosphide (InP). InP is believed to be particularly suitable as a substrate for lasers operating at wavelengths in the 1.3 to 1.5 micron ($\mu$m) range. Other substrates may also be suitable, however, depending on the particular device design and the lasing wavelength desired. For example, other compound semiconductor materials such as gallium arsenide (GaAs) or gallium nitride (GaN) may be used in some embodiments. Other substrates such as silicon may further be used, particularly in the case of processes involving wafer bonding. Such a process is discussed further in the description of FIG. 2 below. Substrate 10 could also be p-type instead of n-type. In this case, DBR 14 would be p-type as well, layers 18 and 20 would be n-type, and layer 24 would be p-type.

Semiconductor-based DBR 14 of FIG. 1 includes multiple alternating semiconductor layers, where each layer has a thickness of one-quarter of the lasing wavelength in the material. Because of the relatively small differences in the indices of refraction within semiconductor materials systems, many layers are typically needed (on the order of 50). This is particularly true in the InP/InGaAlAs system often used for DBRs at wavelengths near 1.5 micron. Active region 16 is typically not intentionally doped, and is formed using a material designed to provide the desired lasing wavelength. In general, one or more quantum wells may be included within the active region. The particular design of the active region may vary substantially, however, and is not important with respect to the structures and methods described herein. P-type layers 18 and p+ layer 20 combine with DBR 14 to form the "lasing" p-n junction, or the p-n junction bounding the active region to inject carriers to establish lasing. Layers 18 and 20 also combine with layer 24 to form a separate "tuning" junction. The heavier doping of p+ layer 20 may facilitate formation of a p+-n junction, so that free carrier injection into region 24 may be enhanced upon forward biasing of the tuning junction. In an embodiment, contact 22 may be made to layer 20 instead of layer 18. Similarly, n-type layer 24 may be more heavily doped near the top in some embodiments to improve the contact made by contact 26, or an additional n+ layer could be interposed between layer 24 and contact 26. In an embodiment, p−, p, and p+, and n−, n, and n+ denote doping at relative doping densities, where p and n type indicate doping at a standard doping density, and the "−" or "+" suffix indicate a relatively lower or higher doping density, e.g. a factor of 2, or an order of magnitude, higher or lower. For example, in an embodiment, n-type doping may indicate a doping density of about $10^{18}/cm^3$, while n+ type doping is about $2 \times 10^{18}/cm^3$ to $10^{19}/cm^3$, and n− doping is about $5 \times 10^{17}/cm^3$; p-type doping may indicate a doping density of about $5 \times 10^{17}/cm^3$, while p+ type doping is about $10^{18}/cm^3$.

DBR 32 is formed at the top of the laser structure of FIG. 1. In this embodiment, the DBR includes six layers, three each of layers 28 and 30. In an embodiment, DBR 32 is dielectric-based, with layer 28 formed from $SiO_2$ and layer 30 from silicon. Contacts 12, 22 and 26 may include various metals, with choices depending on, for example, the semiconductor materials used in a particular embodiment and the particular fabrication process used. The contacts may be formed from multiple metallic layers, including layers for adhesion and/or diffusion barriers. "Ohmic" as used herein refers to contacts which pass current to a similar degree in both directions, as opposed to rectifying contacts. The ideality of the contacts may vary depending on the materials system involved, however, such that the current-voltage characteristics of contacts referred to herein may not be perfectly linear.

In an exemplary embodiment of the structure of FIG. 1 for use at a wavelength of about 1.55 microns, substrate 10 and layers 18, 20 and 24 may be formed from InP. Layer 18 may be about 0.5 micron thick and have a hole concentration of about $5 \times 10^{17}$ cm$^{-3}$, layer 20 may be about 0.25 micron thick and have a hole concentration of about $1 \times 10^{18}$ cm$^{-3}$, and layer 24 may be about 1 micron thick with an electron concentration of about $5 \times 10^{17}$ cm$^{-3}$. DBR 14 may in such an embodiment be formed from alternating layers of InP and an indium gallium aluminum arsenide (InGaAlAs) alloy, with a total thickness of about 9.4 microns. In particular, the InP layers could be about 0.12 micron thick and the InGaAlAs layers about 0.11 micron thick. The In fraction of the InGaAlAs in such and embodiment may be about 0.527, the Ga fraction about 0.334, and the Al fraction about 0.139. The active region may be formed using alloys of undoped indium gallium arsenide phosphide (InGaAsP), and have a thickness of about 0.23 micron. The dielectric DBR at the top of the structure in such an example could have alternating layers of $SiO_2$ about 0.27 micron thick and Si about 0.11 micron thick. The semiconductor layers of the structure may be grown by molecular beam epitaxy. Alternatively, other techniques such as metal organic chemical vapor deposition may be suitable in some embodiments. Such growth techniques may be similarly applied to all of the structures described herein. Contacts 22 and 26, shown in cross-section, are annular contacts in the embodiment of FIG. 1. As used herein, "annular" refers to an encircling shape which may be circular (generally preferred for VCSELs), rectangular or any shape suitable for surrounding another region.

It will be appreciated that for the structure of FIG. 1 and all other structures described herein, multiple specific implementations are possible and contemplated. For example, the material compositions and layer thickness will likely vary from those in the above example when the structure is designed to operate at a different wavelength. Positions of the various layers may as also be selected in order to advantageously position the active region at a maximum with respect to the axial (vertical) standing wave in the cavity, and/or to position lossy elements, such as contact regions at nulls in this standing wave pattern. Separate "spacer" layers may be employed to realize such advantageous vertical placement, or the appropriate spacings may be built into some of the layers included in the structures described herein. As another example, different no types and combinations of mirrors could be used. For example, both mirrors could be semiconductor DBRs, or both dielectric DBRs, or other types of mirrors, such as metal mirrors, might be suitable. Some of these options are discussed in more detail with respect to FIGS. 2, 4 and 5 below. In a preferred embodiment of the structure of FIG. 1, the semiconductor materials outside of the active region and within the laser cavity are transparent to radiation at the lasing wavelength. In other words, absorbing layers are not included between the active regions and the cavity mirrors. There may of course be some parasitic absorption inherent to the structure, such as defect-based recombination at surfaces and interfaces, but layers which are intended to act as absorbers of the lasing radiation are preferably not included. The structures of FIGS. 1, 2, and 4–6 are fabricated as mesa structures, so that structures such as DBR 32 and semiconductor region 24 appear circular when viewed from the top. Mesa fabrication is believed to be convenient for these three-terminal VCSEL structures, but other configurations may also be suitable, such as implant isolation with vias (via holes) down to buried contacts.

Operation of the structure of FIG. 1 as a laser may include applying a forward bias across the lasing junction using contacts 12 and 22. In the embodiment of FIG. 1, this would involve applying a potential difference between the contacts such that contact 12 is at a more negative potential than contact 22. For tuning of the laser, a potential difference may also be applied across the tuning junction using contacts 26 and 22. In an embodiment, the tuning junction is forward biased. In the case of FIG. 1, this would correspond to applying a lower potential to contact 26 than to contact 22. If contact 22 were held at ground potential, for example, separate negative voltages could be applied to contacts 12 and 26. Forward biasing of the tuning junction causes injection of carriers into the region surrounding the junction, which may alter the refractive index in this region by altering the free carrier density. Because the tuning junction is within the lasing cavity bounded by mirrors 32 and 14, altering the refractive index may alter the resonance frequency of the cavity and the wavelength of the laser. The amount of forward bias across the tuning junction may be adjusted independently of the forward bias across the lasing junction, thereby allowing independent control of the laser's gain and wavelength.

VCSEL With Tuning Junction and Multi-quantum-well Structure

Figure 2:
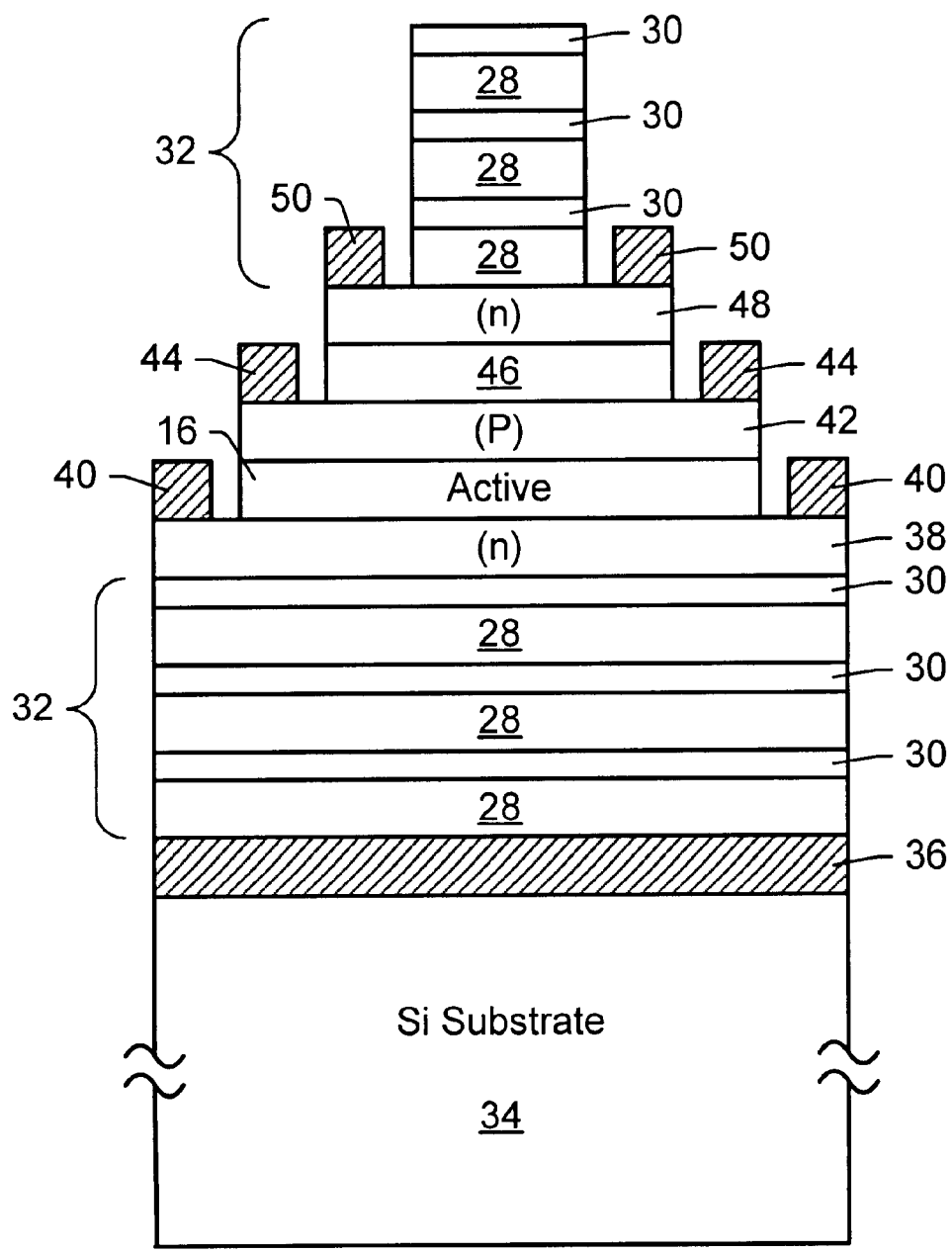
FIG. 2 is a cross-sectional illustration of the layer structure of an exemplary embodiment of a 3-terminal VCSEL with a variable refractive index structure within the tuning junction.

The layer structure of another embodiment of a tunable VCSEL structure is shown in FIG. 2. Similarities between the structure of FIG. 2 and that of FIG. 1 include an additional tuning junction formed within the laser cavity, and a dielectric DBR 32 at the top of the structure. In the embodiment of FIG. 2, the structure is supported by a silicon substrate 34. Instead of the semiconductor DBR used as the bottom mirror in FIG. 1, the structure of FIG. 2 includes a combination of a dielectric DBR and a metal mirror 36. Semiconductor layers 38 and 42 form the lasing p-n junction bounding active region 16. The lasing junction may be controlled through annular contacts 40 and 44. The tuning junction in the embodiment of FIG. 2, including semiconductor layers 42 and 48, bounds a variable refractive index region 46. An electric field may be applied to the tuning junction, including the variable refractive index region, using annular contacts 50 and 44.

Use of a silicon substrate, as in the embodiment of FIG. 2, may be desirable for various reasons, including silicon's low cost and relative sturdiness as compared to other substrate materials. Growth of high-quality light-emitting materials (e.g., compound semiconductors) directly on silicon is extremely difficult, however. Fabrication of a structure such as that of FIG. 2 may involve wafer bonding techniques, in which a portion of the structure containing the semiconductor layers within the laser cavity is grown on a different substrate, and this portion is bonded to another portion of the structure grown on the Si substrate. The different substrate may then be etched away. The combination of dielectric DBR 32 and metal mirror 36 in the embodiment of FIG. 2 may be desirable for increasing the reflectivity of the bottom mirror with respect to the top mirror. Metal layer 36 may be formed from various metals, such as aluminum or silver. Considerations in the choice of metal may include reflectivity, adhesion, and ability to withstand processing temperatures. Metal layer 36 may include an alloy or multilayer metal, and additional layers such as adhesion layers or reaction barriers may be included.

Variable refractive index layer 46 is a structure which exhibits a change in refractive index with applied electric field. In an embodiment, layer 46 includes an MQW structure. In this case, the structure may include undoped, uncoupled quantum wells which exhibit an electric field induced change in refractive index through the quantum confined Stark effect. In an embodiment, these could be InGaAs quantum wells with InAlAs barriers. The barriers may be of sufficient thickness to prevent coupling of energy states within the wells when no electric field is applied. Alternatively, the structure may contain coupled quantum wells, possibly with doped barrier regions, and exhibit refractive index changes through carrier transfer effects or excitonic effects. For example, such a coupled-well structure could include two InGaAs quantum wells separated by an InP barrier. In an embodiment, the wells could have thicknesses in the 20 Å–50 Å range, and the barrier a thickness in the 30 Å to 100 Å range. In another embodiment, a coupled-well structure could include an InGaAs quantum well separated from an n+AlInGaAs barrier by an undoped AlInGaAs spacer layer. The doped barrier may supply electrons for transfer into the well when an electric field is applied. Such a structure may also include, on the other side of the InGaAs well, an AlInAs barrier layer containing an undoped portion and a depleted p-type portion such that the well is empty with no applied field. Exemplary layer thickness for such a structure include 90 Å for the well, 500 Å for the doped barrier, 210 Å for the undoped spacer, 600 Å for the AlInAs barrier, and 150 Å for the p-type portion of the AlInAs barrier. In general, the MQW structure may contain as few as two quantum wells, and the wells may either be identical or have varying thicknesses and depths. In other embodiments, the variable refractive index layer may include a single quantum well or a single material layer, although an MQW structure is believed to generally show a stronger variation of refractive index with electric field. In an embodiment, the layers within the laser cavity and outside of the active region of the structure of FIG. 2 are transparent to radiation at the lasing wavelength, as discussed above with respect to the structure of FIG. 1. In some cases, however, the absorption edge of the variable refractive index structure may be near the lasing wavelength, particularly if the quantum-confined Stark effect is the tuning mechanism.

In an exemplary embodiment of the structure of FIG. 2 for use at a wavelength near 1.55 microns, mirror layer 36 may be an aluminum layer about 0.3 micron thick. The upper and lower dielectric DBRs may be formed from alternating $SiO_2$ layers about 0.27 micron thick and Si layers about 0.11 micron thick. Semiconductor layers 38 and 48 may be formed from n-type InP with a carrier concentration of about $5 \times 10^{17}$ $cm^{-3}$, and layer 42 may be formed from p-type InP with a similar carrier concentration. The active region in this embodiment may be formed from undoped InGaAsP alloys, have a thickness of about 0.23 micron and have an average refractive index of about 3.394. In particular, the active region may in this embodiment include five 80 Å-thick wells of an InGaAsP composition giving a bandgap of about 1.63 microns, while the barriers may be about 150 Å thick and of an InGaAsP composition giving a bandgap of about 1.18 microns. Variable refractive index layer 46 may be formed in this embodiment to have InGaAs wells and InAlAs barriers, a total thickness of about 0.12 micron and an average refractive index of about 3.3.

Figure 3:
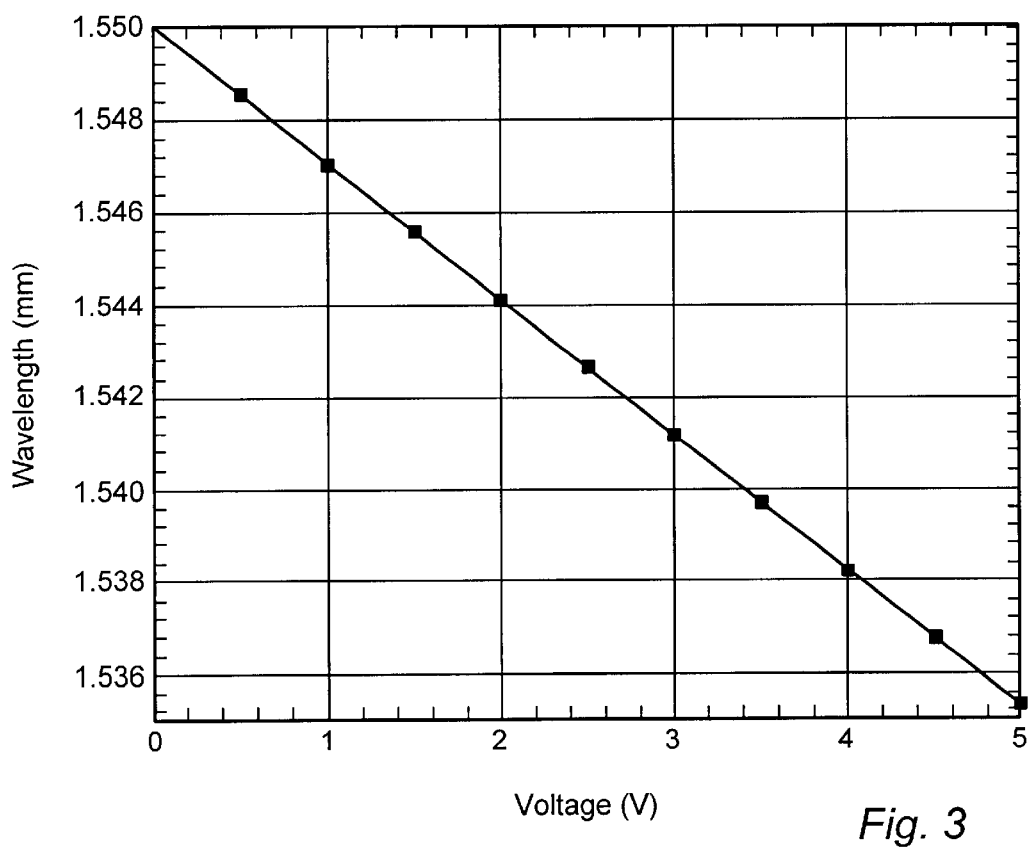
FIG. 3 is a plot of calculated tuning performance of a laser having a layer structure similar to that of FIG. 2.

A plot of the calculated output wavelength for this exemplary structure as a function of reverse-bias voltage between contacts 50 and 44, is shown in FIG. 3. It can be seen that the wavelength is predicted to change by almost 15 nm when a 5-volt tuning voltage is applied. This is a larger variation than is believed to be achievable with the free-carrier based tuning of the structure of FIG. 1. As noted above, tuning of the structure of FIG. 2 is believed to be allowed by a dependence of the refractive index of variable refractive index region 46 on the field applied to the region. Depending on the details of the variable refractive index structure, this dependence may arise through various effects, including one or more of: Stark effect, quantum confined Stark effect, carrier transfer effects, and excitonic effects. An electric field is applied to the variable refractive index region in the structure of FIG. 2 by applying a bias between contacts 50 and 44. A reverse bias is currently preferred, though a forward bias may also be suitable in some embodiments. In an embodiment, contact 44 is held at ground potential, contact 50 is connected to positive voltage to reverse-bias the tuning junction, and contact 40 is connected to negative voltage to provide gain.

Figure 4:
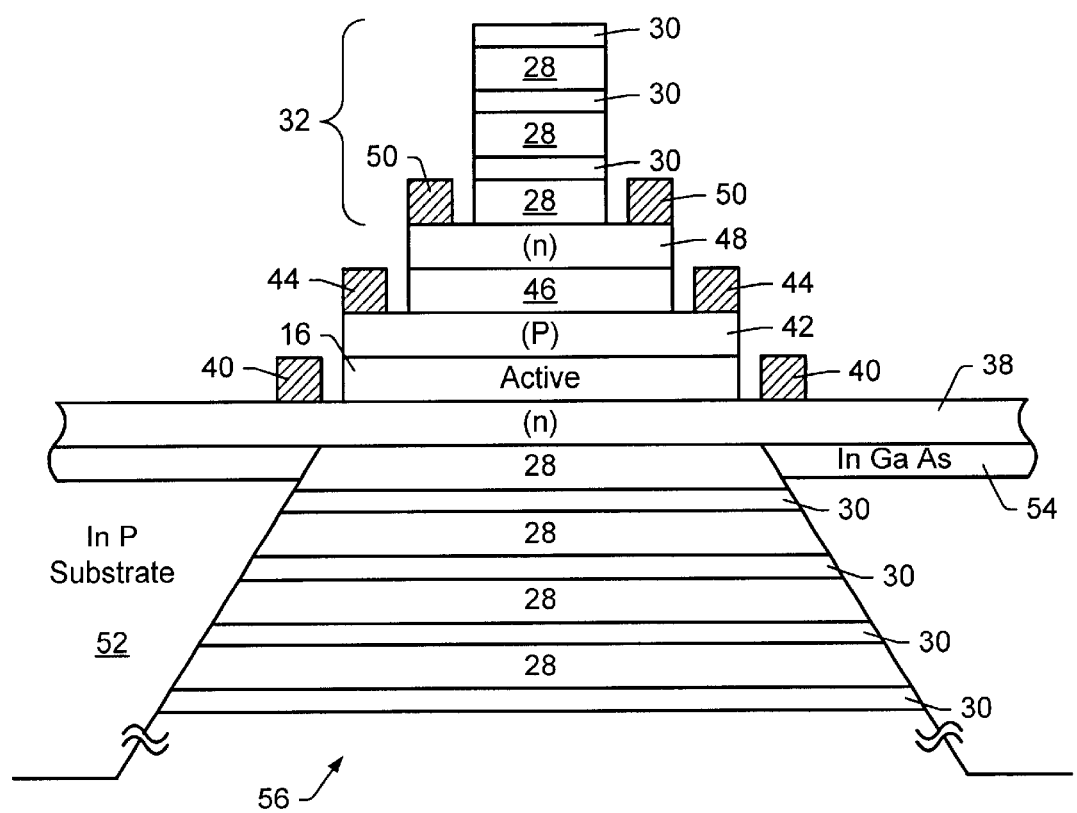
FIG. 4 is a cross-sectional illustration of the layer structure of an alternative embodiment of the 3-terminal VCSEL of FIG. 2.
Figure 5:
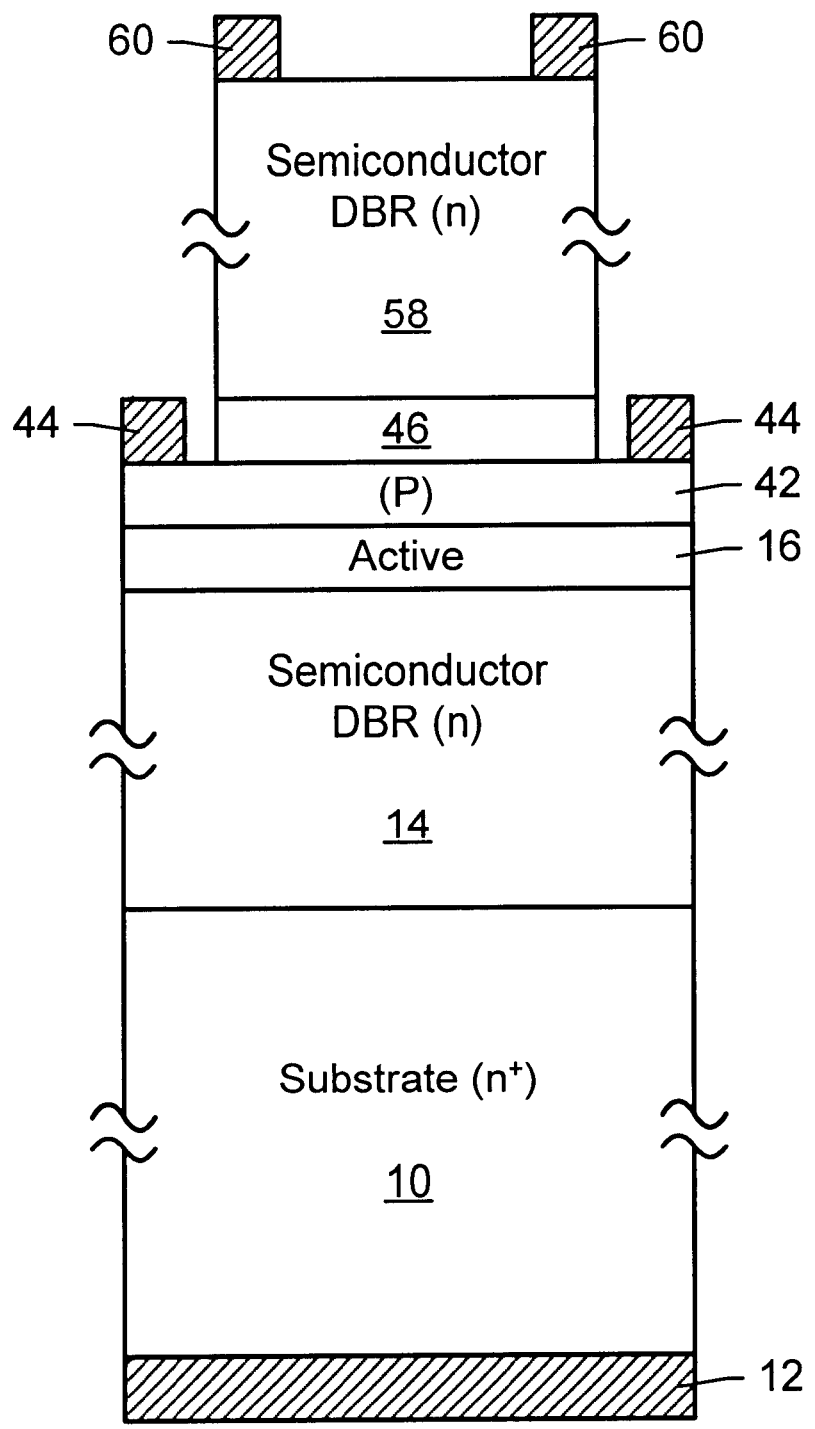
FIG. 5 is a cross-sectional illustration of the layer structure of a further alternative embodiment of the 3-terminal VCSELs of FIGS. 2 and 4.

Further embodiments of the general structure of FIG. 2 which illustrate exemplary variations in mirror formation are shown in FIGS. 4 and 5. The structure of FIG. 4 is similar to that of FIG. 2, except that instead of a combined dielectric DBR and metal mirror on a silicon substrate, a thicker dielectric DBR is formed in a recess on an InP substrate. This is another example of the various types of mirrors which can be used for any of the structures described herein. The InP substrate is suitable for a laser using semiconductor layers from In-based materials systems, such as those used for making lasers in the 1.3 to 1.55 micron wavelength range. The approach of FIG. 4 allows growth of all semiconductor layers on the InP substrate, so that wafer bonding is not required. An opening may be etched into the substrate from the back after layer growth, and dielectric DBR 56 may be deposited within the opening. InGaAs layer 54 may be used as an etch stop during etching of the opening. In the embodiment of FIG. 4, lower DBR 56 has an additional pair of dielectric layers as compared to top DBR 32, in keeping with the higher reflectivity generally needed for the bottom mirror.

In the embodiment of FIG. 5, two semiconductor DBRs are used for the mirrors of a structure otherwise similar to those of FIGS. 2 and 4. Substrate 10 and bottom semiconductor DBR 14 are similar to those in the structure of FIG. 1, and contact to the n-type side of the lasing junction can therefore be made at the back of the substrate. P-type semiconductor layer 42 and MQW structure 46 are similar to those described above in the discussion of FIG. 2. N-type semiconductor DBR 58 is used in the embodiment of FIG. 5 to provide both the top mirror and the n-type side of the tuning junction. In an embodiment for which lower DBR 14 has a thickness of about 9.4 microns, upper DBR 58 may have a thickness of about 6 microns, if both DBRs are made using InP and InGaAlAs layers.

VCSEL With Dielectrically-spaced Control Contact

The three-terminal surface-emitting laser structures discussed with respect to FIGS. 1–5 above all include an additional tuning junction through which the laser may be tuned. Another approach to a three-terminal tunable VCSEL is shown in the layer structure of FIG. 6. The embodiment of FIG. 6 has a bottom mirror similar to those of FIGS. 1 and 5, with n-type DBR 14 over n-type substrate 10, coupled to contact 12. The other side of active region 16, however, has a single p-type layer 62 coupled to annular contact 64 to complete the lasing junction, and no additional tuning junction. Dielectric DBR 32 forms the top mirror of the laser cavity in the embodiment of FIG. 6. The third terminal in this embodiment is annular contact 68, which is separated from p-type region 62 by annular dielectric 66. In an exemplary embodiment, semiconductor layers 10 and 62 are formed from InP, and active region 16 and DBR 14 are formed from In-based alloys, as discussed further with respect to these layers in FIGS. 1–5. P-type layer 62 may have a thickness of about 2 microns in such an embodiment, and a carrier concentration of about $5 \times 10^{17}$ $cm^{-3}$. Dielectric 66 may include $SiO_2$, or other suitable dielectrics such as silicon nitride or oxynitride. In an embodiment, dielectric 66 is formed in a manner similar to that used to form sidewall spacers on gate conductors of field effect transistors. In such an embodiment, a dielectric layer is deposited conformally over a step, such as the step shown in layer 62 of FIG. 6. Anisotropic etching in a vertical direction may then be used to remove the substantially horizontal portions of this dielectric layer, leaving behind a "spacer" portion 66 in the region of the step. Since layer 62 has a cylindrical shape, dielectric 66 is an annular dielectric laterally surrounding the upper portion of layer 62. Formation of dielectric 66 could be done prior to formation of DBR 32 and the metal contacts. Alternatively, dielectric 66 might be formed using one or more of the depositions used to form DBR 32.

Figure 6:
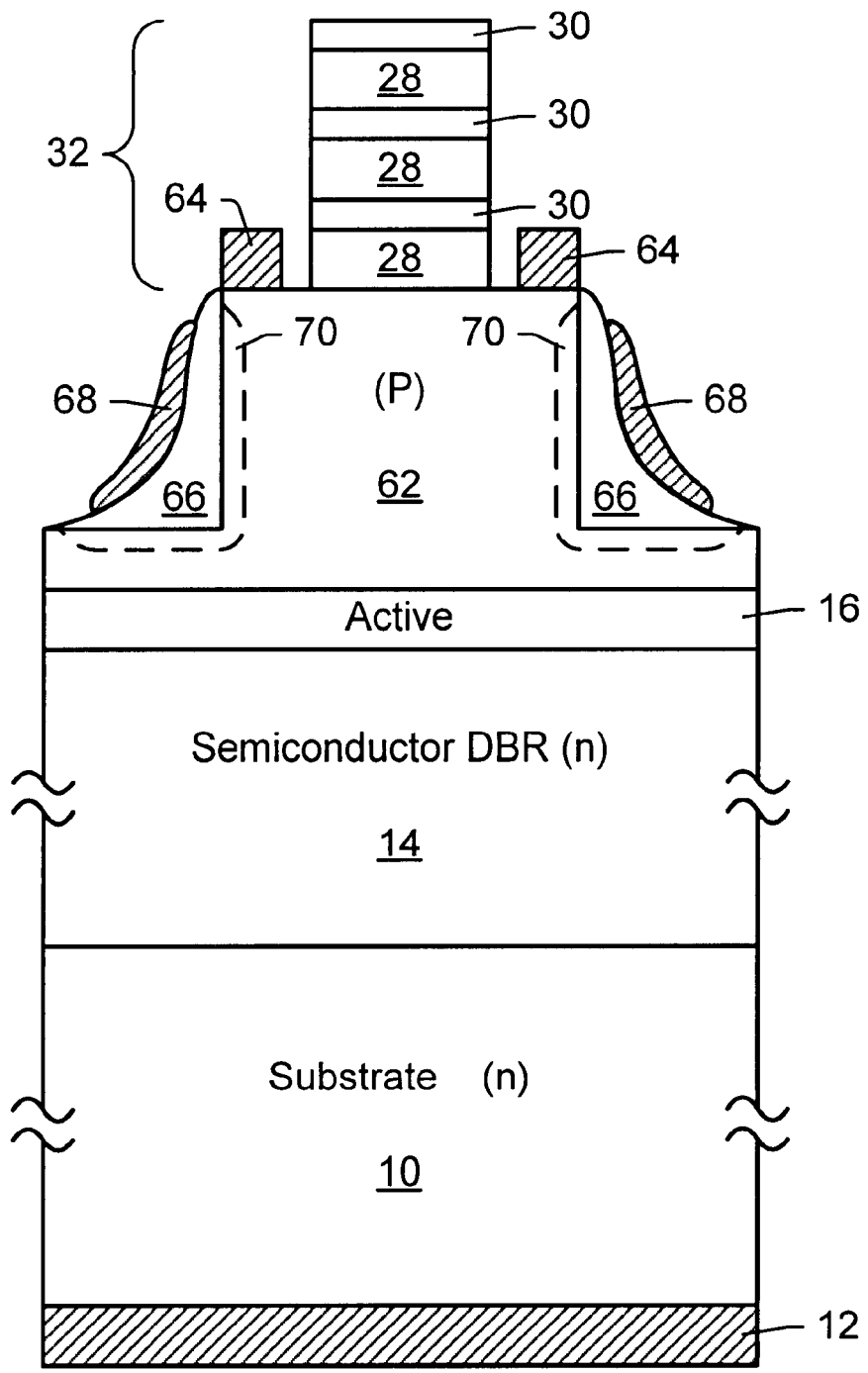
FIG. 6 is a cross-sectional illustration of the layer structure of a 3-terminal VCSEL having a dielectrically spaced control contact.

During operation of a laser having the layer structure shown in FIG. 6, a forward bias is applied to the lasing junction using contacts 12 and 68 to establish gain and lasing. The laser wavelength may then be tunable by applying a voltage between contact 68 and contact 64 such that an annular depletion region 70 (denoted by dashed lines) is formed within p-type layer 62. In the embodiment of FIG. 6, this could be done by applying a positive potential to contact 68 as compared to contact 64, such that negative charge is induced in region 62 (on the other "plate" of the capacitor formed by region 62, dielectric 66, and contact 68). Varying the amount of potential difference between contacts 64 and 68 may vary the width of the depletion region formed at the outside of region 62. The undepleted area of region 62 may therefore be varied in this way. Variation of the undepleted area corresponds to variation of the active area running vertically through the center of the device, or the area in which current injection occurs. This varies the beamwidth of the laser, which may vary its wavelength. Thus, in the three-terminal tunable VCSEL embodiment shown in FIG. 6 and described above, the invention comprises a SEL structure, comprising: a first semiconductor region of a first conductivity type coupled to a first electrical contact; a second semiconductor region of a second conductivity opposite to the first conductivity type, wherein the second region is coupled to a second electrical contact; an active region interposed between the first and second semiconductor regions; and a third electrical contact dielectrically spaced from the second semiconductor region. In an embodiment, the third contact is adapted to modulate a cross-sectional area of an undepleted portion of the second semiconductor region. In an embodiment, the second semiconductor region comprises a substantially vertical sidewall, and further comprising a dielectric layer interposed between the sidewall and the third contact. The first semiconductor region comprises a distributed Bragg reflector, and the SEL structure comprises a dielectric-based distributed Bragg reflector adjacent the second semiconductor region. The invention also includes a related method for tuning a surface-emitting laser, which includes the step of electrically modulating a cross-sectional area of a gain region of the laser. The step of electrically modulating comprises applying a potential difference between a second contact coupled to one side of a p-n junction within the laser and a third contact dielectrically spaced from the same side of the p-n junction, wherein a first contact is coupled to the other side of the p-n junction. In an embodiment, carriers are injected across the p-n junction by applying a potential difference between the first and second contacts.

It will be appreciated that many different implementations of a laser having the general structures of FIGS. 1–2 and 4–6 are possible. For example, the doping polarities of the semiconductor layers could be reversed in each structure, and corresponding switched voltage polarities applied. Various modifications may be made, such as increasing the doping of a semiconductor layer in the area near an ohmic contact.

The present invention, therefore, is well adapted to carry out the objects and attain the ends and advantages mentioned, as well as others inherent therein. While the invention has been depicted and described and is defined by reference to particular preferred embodiments of the invention, such references do not imply a limitation on the invention, and no such limitation is to be inferred. The invention is capable of considerable modification, alteration and equivalents in form and function, as will occur to those ordinarily skilled in the pertinent arts. The depicted and described preferred embodiments of the invention are exemplary only and are not exhaustive of the scope of the invention. Consequently, the invention is intended to be limited only by the spirit and scope of the appended claims (if any), giving full cognizance to equivalents in all respects.

What is claimed is:

1. A surface-emitting laser structure, comprising:
   a first semiconductor region of a first conductivity type coupled to a first electrical contact;
   a second semiconductor region of the first conductivity type coupled to a second electrical contact;
   a third semiconductor region of a second conductivity type opposite to the first conductivity type, wherein the third region is, coupled to a third electrical contact and interposed between the first and second semiconductor regions, and wherein the portion of the laser structure extending between the second and third contacts is substantially transparent to radiation at the lasing wavelength of the structure; and an active region interposed between the first and third semiconductor regions.

2. The structure of claim 1, wherein the first and second semiconductor regions comprise n-type indium phosphide and the third semiconductor region comprises p-type indium phosphide.

3. The structure of claim 1, wherein the first semiconductor region comprises a distributed Bragg reflector.

4. The structure of claim 1, wherein the second semiconductor region comprises a distributed Bragg reflector.

5. The structure of claim 1, further comprising a dielectric-based distributed Bragg reflector arranged adjacent the second semiconductor region.

6. The structure of claim 1, further comprising a dielectric-based distributed Bragg reflector arranged adjacent the first semiconductor region.

7. The structure of claim 1, further comprising a variable refractive index structure interposed between the second and third semiconductor regions.

8. The structure of claim 7, wherein the variable refractive index structure comprises a multiple quantum well structure.

9. The structure of claim 8, wherein the multiple quantum well structure is adapted to exhibit a change in refractive index upon application of an effective amount of potential difference between the second and third contacts.

10. The structure of claim 9, wherein the multiple quantum well structure is adapted to exhibit the quantum confined Stark effect.

11. The structure of claim 8, wherein the multiple quantum well structure comprises indium gallium arsenide and indium aluminum arsenide layers.

12. A method for tuning a surface-emitting laser, said method comprising applying a potential difference across a tuning p-n junction formed within the laser cavity, wherein the tuning p-n junction is separate from the p-n junction used to provide laser gain, and wherein the tuning p-n junction is substantially transparent at the lasing wavelength of the structure.

13. The method of claim 12, wherein said applying a potential difference comprises injecting carriers across the tuning junction.

14. The method of claim 13, wherein said injecting comprises modulating a free carrier density of a portion of the laser cavity in the vicinity of the tuning junction.

15. The method of claim 14, wherein said injecting further comprises modulating a refractive index of the laser cavity in the vicinity of the tuning junction.

16. The method of claim 12, wherein said applying the potential difference across the tuning junction comprises applying the potential difference between a second semiconductor region of a first conductivity type and a third semiconductor region of a second conductivity type opposite to the first conductivity type, wherein an active region of the laser is interposed between the second semiconductor region and a first semiconductor region of the first conductivity type.

17. The method of claim 16, wherein said applying the potential difference across the tuning junction comprises modulating an electric field applied to a variable refractive index structure interposed between the second and third semiconductor regions.

18. The method of claim 17, wherein said modulating the electric field comprises modulating a refractive index of the variable refractive index structure.

* * * * *